United States Patent
Lee

(10) Patent No.: US 7,217,326 B2
(45) Date of Patent: May 15, 2007

(54) CHEMICAL VAPOR DEPOSITION APPARATUS

(75) Inventor: Ho Lee, Cheonan (KR)

(73) Assignee: Samsung Electronics Co., Ltd, Suwon-si, Gyeonggi-do (KR)

( * ) Notice: Subject to any disclaimer, the term of this patent is extended or adjusted under 35 U.S.C. 154(b) by 0 days.

(21) Appl. No.: 10/750,023

(22) Filed: Dec. 31, 2003

(65) Prior Publication Data

US 2004/0200413 A1 Oct. 14, 2004

(30) Foreign Application Priority Data

Apr. 14, 2003 (KR) .................. 10-2003-0023398

(51) Int. Cl.
C23C 16/455 (2006.01)
C23C 16/00 (2006.01)

(52) U.S. Cl. ........................................ 118/715

(58) Field of Classification Search ............... 118/715; 156/345.33, 345.34
See application file for complete search history.

(56) References Cited

U.S. PATENT DOCUMENTS

| | | | |
|---|---|---|---|
| 5,558,717 A * | 9/1996 | Zhao et al. ............... 118/715 |
| 5,610,106 A * | 3/1997 | Foster et al. ............. 438/680 |
| 5,766,364 A * | 6/1998 | Ishida et al. ............. 118/725 |
| 5,885,356 A * | 3/1999 | Zhao et al. ............ 118/723 ER |
| 5,911,834 A * | 6/1999 | Fairbairn et al. ........... 134/1.3 |
| 5,964,947 A * | 10/1999 | Zhao et al. ............... 118/715 |
| 5,996,528 A * | 12/1999 | Berrian et al. ......... 118/723 E |
| 5,997,649 A * | 12/1999 | Hillman .................. 118/715 |
| 6,063,198 A * | 5/2000 | Bang et al. ............... 118/715 |
| 6,106,625 A * | 8/2000 | Koai et al. ............... 118/715 |
| 6,173,673 B1 * | 1/2001 | Golovato et al. ........ 118/723 E |
| 6,302,057 B1 * | 10/2001 | Leusink et al. .......... 118/723 E |
| 6,364,949 B1 * | 4/2002 | Or et al. .................. 118/69 |
| 6,410,089 B1 * | 6/2002 | Guo et al. ................ 427/250 |
| 6,444,042 B1 * | 9/2002 | Yang et al. ............... 118/724 |
| 6,565,662 B2 * | 5/2003 | Amano et al. ............. 118/715 |
| 6,635,115 B1 * | 10/2003 | Fairbairn et al. .......... 118/719 |
| 6,772,827 B2 * | 8/2004 | Keller et al. ............... 165/53 |
| 2002/0069968 A1 * | 6/2002 | Keller et al. ............ 156/345.33 |
| 2002/0144783 A1 * | 10/2002 | Tran et al. ............. 156/345.33 |
| 2003/0066607 A1 * | 4/2003 | White et al. ........... 156/345.34 |
| 2003/0075107 A1 * | 4/2003 | Miyano et al. ............. 118/715 |

(Continued)

FOREIGN PATENT DOCUMENTS

JP 2-73624 3/1990

OTHER PUBLICATIONS

WEBSTER'S II New Riverside University Dictionary, "to" p. 1214, 1994.*

(Continued)

*Primary Examiner*—Jeffrie R. Lund
(74) *Attorney, Agent, or Firm*—MacPherson Kwok Chen & Heid LLP

(57) ABSTRACT

A chemical vapor deposition apparatus is provided, which includes: a chamber having an inner space; a gas feed member for supplying a gas into the chamber; a susceptor disposed in the chamber and supporting a substrate; a diffuser partitioning the inner space of the chamber into first and second partitions and having a plurality of holes connecting the first partition and the second partition for gas communication; a diffuser frame incorporated into the diffuser; and an insulating frame disposed between the chamber and the diffuser.

12 Claims, 2 Drawing Sheets

U.S. PATENT DOCUMENTS

| | | | |
|---|---|---|---|
| 2003/0124842 A1* | 7/2003 | Hytros et al. | 438/680 |
| 2004/0050492 A1* | 3/2004 | Tsuei et al. | 156/345.33 |
| 2004/0071874 A1* | 4/2004 | Shimizu et al. | 427/248.1 |
| 2004/0118345 A1* | 6/2004 | White et al. | 118/723 E |
| 2004/0118519 A1* | 6/2004 | Sen et al. | 156/345.33 |
| 2004/0134611 A1* | 7/2004 | Kato et al. | 156/345.33 |
| 2004/0187779 A1* | 9/2004 | Park et al. | 118/715 |
| 2004/0200413 A1* | 10/2004 | Lee | 118/715 |
| 2005/0000430 A1* | 1/2005 | Jang et al. | 118/715 |
| 2005/0000432 A1* | 1/2005 | Keller et al. | 118/715 |
| 2005/0022735 A1* | 2/2005 | Breitung et al. | 118/715 |
| 2005/0028935 A1* | 2/2005 | Wickramanayaka et al. | 156/345.34 |
| 2005/0183827 A1* | 8/2005 | White et al. | 156/345.34 |

OTHER PUBLICATIONS

Patent Abstracts of Japan, Publication No. 02-073624, Mar. 13, 1990.

* cited by examiner

CHEMICAL VAPOR DEPOSITION APPARATUS

BACKGROUND OF THE INVENTION (a) Field of the Invention

The present invention relates to a chemical vapor deposition apparatus.

(b) Description of the Related Art

Chemical vapor deposition (CVD) forms a thin film on a substrate by the reaction of vapor phase chemicals (reactants) that contain the required constituents. The reactant gases are introduced into a reaction chamber and decomposed and reacted at a heated surface of the substrate to form the thin film. A wide variety of thin films utilized in a manufacturing process of a semiconductor device such as a thin film transistor (TFT) liquid crystal display (LCD) is prepared by CVD.

A CVD system includes a diffuser for evenly distributing the reactant gases over a substrate. The diffuser is made of metal to serve as a powered electrode, and it is combined with a diffuser frame serving as an electrode extension by bolts. Since there is a gap between the diffuser and the diffuser frame, an arc may be generated in the gate when the diffuser 70 is supplied with high radio frequency power. The arc may remove oxide such as $Al_2O_3$ coated on the diffuser and the diffuser frame, and the metal forming the diffuser may melt and drop onto the substrate. The dropped metal component generates splash defects to reduce the quality of deposited thin films.

In addition, since the bolts for combining the diffuser and the diffuser frame make gaps with the diffuser and the diffuser frame, arc generation may be also made in the gaps. Accordingly, several particles are separated from the bolts to cause defects.

SUMMARY OF THE INVENTION

A chemical vapor deposition apparatus according to an aspect of the present invention is provided, which includes: a chamber having an inner space; a gas feed member for supplying a gas into the chamber; a susceptor disposed in the chamber and supporting a substrate; a diffuser partitioning the inner space of the chamber into first and second partitions and having a plurality of holes connecting the first partition and the second partition for gas communication; and an insulating frame disposed between the chamber and the diffuser, wherein the diffuser includes an extension overlapping a surface of the insulating frame.

A chemical vapor deposition apparatus according to an aspect of the present invention is provided, which includes: a chamber having an inner space; a gas feed member for supplying a gas into the chamber; a susceptor disposed in the chamber and supporting a substrate; a diffuser partitioning the inner space of the chamber into first and second partitions and having a plurality of holes connecting the first partition and the second partition for gas communication; a diffuser frame incorporated into the diffuser; and an insulating frame disposed between the chamber and the diffuser.

The extension of the diffuser may have an "L" shape.

The diffuser may include Al or stainless steel, the insulating frame may include ceramic, and/or the substrate comprises glass. The substrate may be prepared for a liquid crystal display.

The apparatus may further include a blocking member for mixing and spreading the gas from the gas feed member before the gas passes through the holes of the diffuser.

Preferably, the diffuser is electrically powered and the susceptor is electrically grounded.

BRIEF DESCRIPTION OF THE DRAWINGS

The present invention will become more apparent by describing embodiments thereof in detail with reference to the accompanying drawings in which.

DETAILED DESCRIPTION OF EMBODIMENTS

The present invention now will be described more fully hereinafter with reference to the accompanying drawings, in which preferred embodiments of the invention are shown. The present invention may, however, be embodied in many different forms and should not be construed as limited to the embodiments set forth herein.

Figure 1:
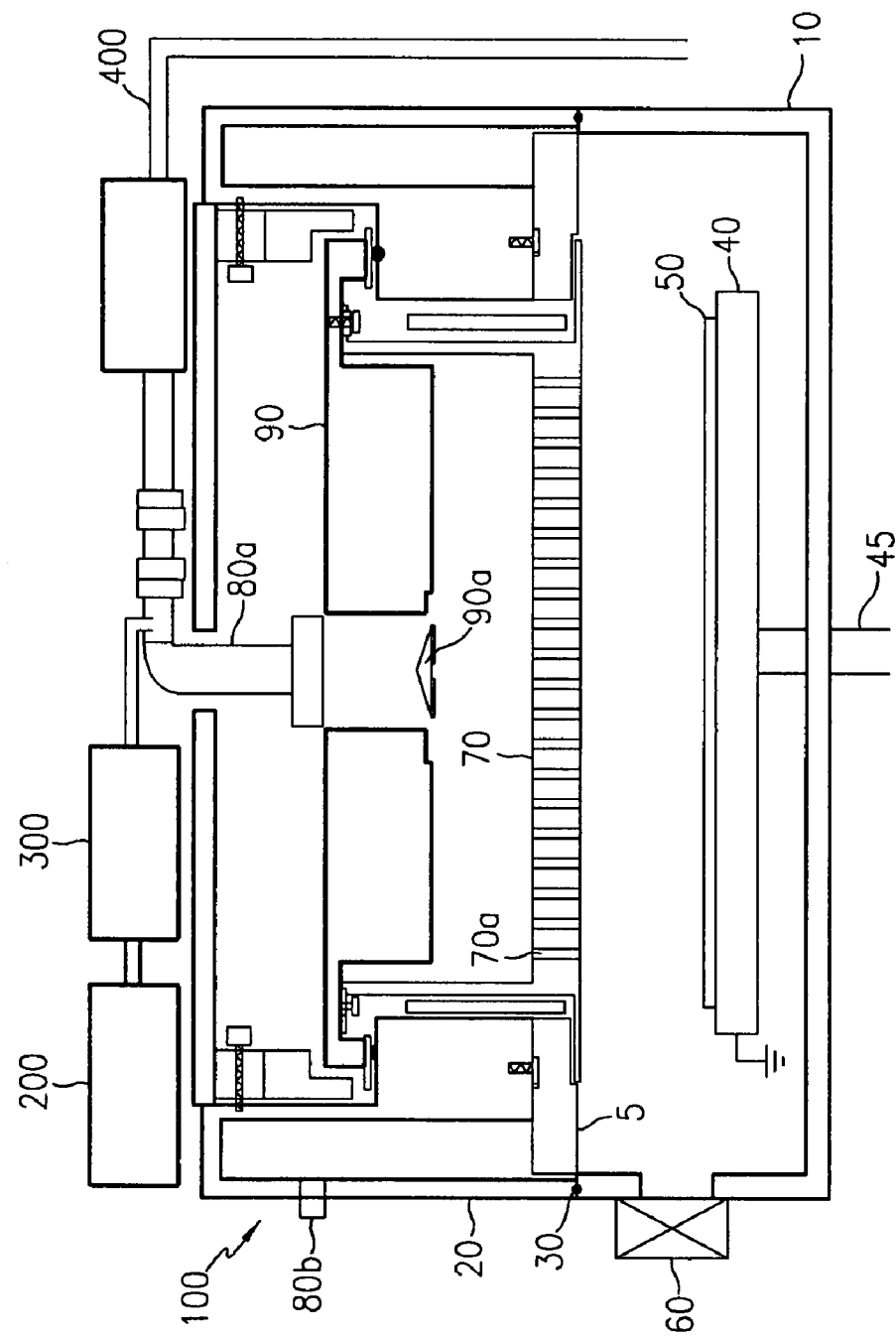
FIG. 1 is a schematic diagram of a CVD apparatus according to an embodiment of the present invention.

FIG. 1 is a schematic diagram of a CVD apparatus according to an embodiment of the present invention.

Referring to FIG. 1, a CVD apparatus according to an embodiment of the present invention includes a reaction chamber (or reactor) 100 defining a reaction space where a thin film is formed by reactant gases.

The chamber 100 includes a chamber body 10 and a chamber lid 20. The chamber lid 20 defines an upper limit of the reaction space and the chamber body 10 defines a lower limit of the reaction space. A seal 30 such as an O-ring seal is disposed at a circumferential interface of the chamber body 10 and the chamber lid 20 for effectively isolating the reaction space from external circumstance.

A slot valve (or a slit valve) 60 is formed at a sidewall of the chamber body 10. A substrate 50 such as transparent glass for an LCD is moved from a load-lock unit (not shown) into the chamber body 10 through the opened slot valve 60.

A susceptor 40 for supporting the substrate 50 is provided in the chamber body 10. The susceptor 40 is movable up and down on a susceptor moving member such as an elevator shaft 45 to move the substrate 50 up and down. The susceptor 40 may include a heater (not shown) therein for heating the substrate 50 disposed thereon.

A gas feed line 400 for supplying gases are connected to an inhalation conduit 80a for delivering the gases into the chamber 100.

A blocking member (or a backing member) 90 is located in front of the inhalation conduit 80a, and a diffuser 70 is disposed below the blocking member 90 and is spaced apart from the blocking member 90 by a predetermined distance.

The blocking member 90 supports the diffuser 70 and it may include a conductive material such as a metal for delivering RF power into the diffuser 70. The blocking member 90 includes a spreader 90a such that the reactant gases entering from the conduit 80a strikes the spreader 90a to be sufficiently mixed in the blocking member 90 and they rotate around the spreader 90a to reach the periphery of the diffuser 70.

The diffuser 70 distributes the reactant gases uniformly over the substrate 50 through a plurality of holes 70a formed therethough. Gaseous by-products are exhausted together with unused reactant gases through an exhaust conduit 80b.

The diffuser 70 is connected to a radio-frequency (RF) power generator 200 to serve as a powered electrode, while the susceptor 40 is grounded to serve as a grounded electrode. In detail, the power generated by RF generator 200 is tuned by a RF match 300, transported to the diffuser 70 through the blocking member 90 through the inhalation conduit 80a.

The diffuser 70 includes a conductor such as Al and stainless steel for playing a role of the powered electrode. The metallic surface of the diffuser 70 is anodized to be covered with oxide for protecting the surface from arc generated by plasma, etc.

Figure 2:
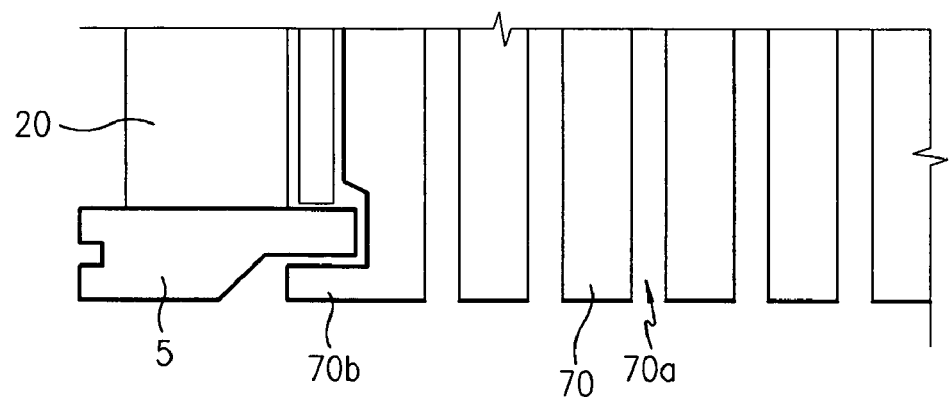
FIG. 2 is an enlarged view of a diffuser according to an embodiment of the present invention.
Figure 3:
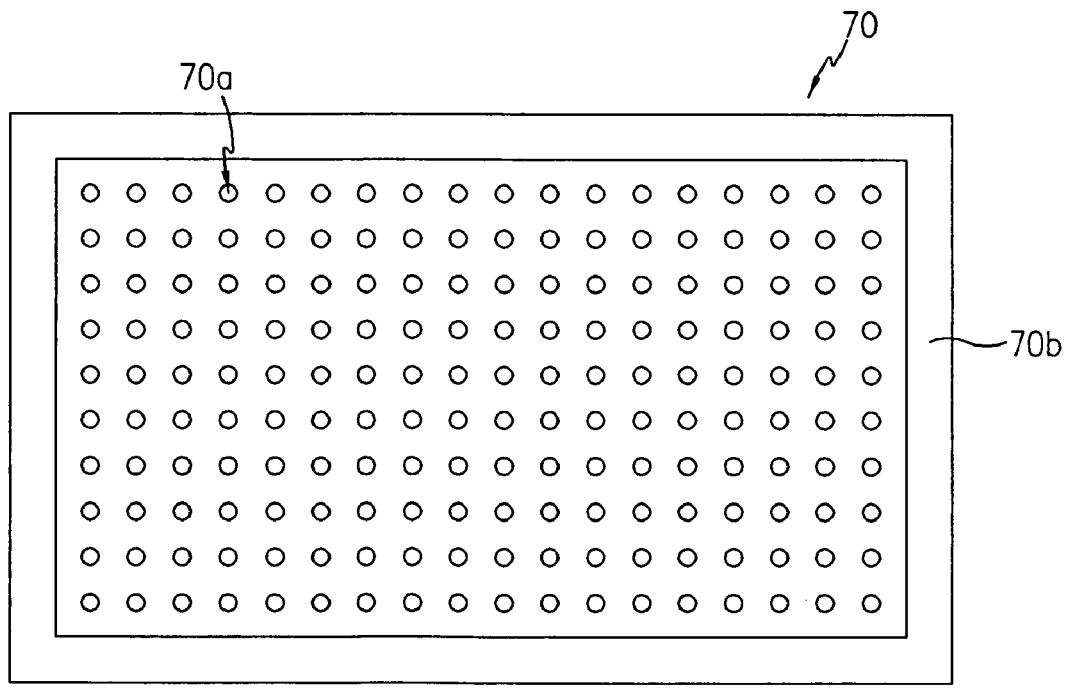
FIG. 3 is a top view of the diffuser shown in FIG. 2.

FIG. 2 is an enlarged view of a diffuser according to an embodiment of the present invention, and FIG. 3 is a top view of the diffuser shown in FIG. 2.

Referring to FIGS. 2 and 3, a diffuser 70 according to an embodiment of the present invention includes an electrode extension serving as a diffuser frame 70b. In other words, the diffuser frame 70b is incorporated into the diffuser 70.

The frame 70b extends under an insulating ceramic frame 5 provided for preventing arc generation between the diffuser 70 and a chamber lid 20.

The frame 70b extends under an insulating ceramic frame 5 provided for preventing arc generation between the chamber 70 and a chamber lid 20.

The incorporation of the diffuser frame 70b and the diffuser 70 prevents particles generated by bolts for combining a diffuser frame and a diffuser separated from each other as well as splash defect due to arcs between the diffuser and the diffuser frame. Accordingly, the quality of deposited thin films is improved.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A chemical vapor deposition apparatus comprising:
   a chamber having an inner space and top, bottom, and side wall;
   a susceptor disposed in the chamber and supporting a substrate;
   a diffuser partitioning the inner space of the chamber into first and second partitions and having an extension extended out from a boundary, wherein the extension of the diffuser is exposed to the inner space of the chamber; and
   an insulating frame disposed between the side wall of the chamber and the diffuser, said insulating frame being disposed on an upper side of the extension of the diffuser and extending to and contacting the side wall of the chamber.

2. The apparatus of claim 1, wherein the extension of the diffuser has an "L" shape.

3. The apparatus of claim 1, wherein the diffuser comprises Al or stainless steel.

4. The apparatus of claim 1, wherein the insulating frame comprises ceramic.

5. The apparatus of claim 1, wherein the substrate comprises glass.

6. The apparatus of claim 1, wherein the substrate is prepared for a liquid crystal display.

7. The apparatus of claim 1, further comprising a blocking member for mixing and spreading the gas from the gas feed member before the gas passes through the holes of the diffuser.

8. The apparatus of claim 1, wherein the diffuser is electrically powered and the susceptor is electrically grounded.

9. The apparatus of claim 1, further comprising:
   a gas feed member for supplying a gas into the chamber.

10. The apparatus of claim 1, wherein the extension overlaps a surface of the insulating frame facing the susceptor.

11. A chemical vapor deposition apparatus comprising:
    a chamber having an inner space and top, bottom, and side wall;
    a susceptor disposed in the chamber and supporting a substrate;
    a diffuser partitioning the inner space of the chamber into first and second partitions and having an extension of an "L" shape extended out from a boundary, wherein the extension of the diffuser is exposed to the inner space of the chamber; and
    an insulating frame disposed between the side wall of the chamber and the diffuser, said insulating frame being disposed on an upper side of the extension of the diffuser and extending to and contacting the side wall of the chamber.

12. The apparatus of claim 11, wherein the extension overlaps a surface of the insulating frame facing the susceptor.

* * * * *